US007463746B2

(12) United States Patent
Caron et al.

(10) Patent No.: US 7,463,746 B2
(45) Date of Patent: Dec. 9, 2008

(54) NARROW OPENING ELECTROACOUSTICAL TRANSDUCING

(75) Inventors: Gerald F. Caron, Andover, MA (US); George E. P. Chute, Milford, MA (US); Allan S. Copeland, Hopedale, MA (US); Eric J. Freeman, Sutton, MA (US); Doug Kramer, Bellingham, MA (US)

(73) Assignee: Bose Corporation, Framingham, MA (US)

( * ) Notice: Subject to any disclaimer, the term of this patent is extended or adjusted under 35 U.S.C. 154(b) by 633 days.

(21) Appl. No.: 10/403,407

(22) Filed: Mar. 31, 2003

(65) Prior Publication Data

US 2005/0259841 A1 Nov. 24, 2005

(51) Int. Cl.
*H04R 1/02* (2006.01)
*H04R 25/00* (2006.01)
*H03G 5/00* (2006.01)
*H05K 5/00* (2006.01)
*A47B 81/06* (2006.01)

(52) U.S. Cl. ........................ 381/345; 381/347; 381/386; 381/350; 381/160; 381/98; 381/103; 181/155; 181/156; 181/199

(58) Field of Classification Search ................ 381/103, 381/98, 391, 345, 349, 347, 350, 160, 386, 381/152, 302, 334, 335, 389, 431, 351; 181/155, 181/156, 199, 103
See application file for complete search history.

(56) References Cited

U.S. PATENT DOCUMENTS 2,904,123 A * 9/1959 Nigro .......................... 181/145
3,089,562 A * 5/1963 Morgillo ...................... 181/156
3,239,028 A * 3/1966 Murray ........................ 181/154
3,517,769 A * 6/1970 Broussard .................... 181/155
3,938,617 A * 2/1976 Forbes ........................ 181/155
3,940,709 A * 2/1976 Heaslett ...................... 330/107
3,987,258 A * 10/1976 Tsutsui et al. ............... 381/334
4,720,867 A 1/1988 Imai et al.
4,722,418 A * 2/1988 Peeters ....................... 181/155
4,903,300 A * 2/1990 Polk ........................... 381/335
4,939,782 A * 7/1990 Gambacurta et al. ......... 381/103
5,056,616 A * 10/1991 Astrom ....................... 181/156
5,173,942 A * 12/1992 Hirose ......................... 381/89

(Continued)

FOREIGN PATENT DOCUMENTS

DE 42 11 114 A1 10/1993

(Continued)

OTHER PUBLICATIONS

European Examination Report dated Jun. 26, 2007, issued in European Patent Application No. 04101207.1, filed Mar. 24, 2004.

(Continued)

*Primary Examiner*—Vivian Chin
*Assistant Examiner*—Devona E. Faulk
(74) *Attorney, Agent, or Firm*—Fish & Richardson P.C.

(57) ABSTRACT

A loudspeaker system having an enclosure having a narrow opening or slot for radiating high frequency acoustic energy. The loudspeaker system has a cover member defining a slot between the cover member and a boundary of a listening space. The loudspeaker system may also include a fixed or adaptive equalizer for modifying frequency response anomalies resulting from the interaction of the acoustic energy, the narrow opening, and the boundary.

26 Claims, 11 Drawing Sheets

U.S. PATENT DOCUMENTS

| | | | | |
|---|---|---|---|---|
| 5,225,639 | A | 7/1993 | Kobayashi et al. | |
| 5,590,208 | A * | 12/1996 | Koyano et al. | 381/338 |
| 6,343,132 | B1 | 1/2002 | Fukuhara et al. | |
| 6,478,108 | B1 | 11/2002 | Linhard et al. | |
| 7,260,235 | B1 | 8/2007 | Henricksen et al. | |

FOREIGN PATENT DOCUMENTS

| | | |
|---|---|---|
| EP | 0 377 262 | 7/1990 |
| EP | 0 481 163 | 4/1992 |
| EP | 0 862 351 | 9/1998 |
| EP | 1 017 166 A | 7/2000 |
| EP | 1 199 907 | 4/2002 |
| JP | 63-142988 | 9/1988 |
| JP | 04-059693 | 5/1992 |
| JP | 04-154298 | 5/1992 |
| JP | 05-122787 | 5/1993 |
| JP | 07-067060 | 3/1995 |
| JP | 08-340600 | 12/1996 |
| JP | 10-304499 | 11/1998 |
| JP | 2001-078288 | 3/2001 |
| JP | 2001-189985 | 7/2001 |
| JP | 2002-199484 | 7/2002 |

OTHER PUBLICATIONS

Notice of Reasons for Rejection dated Jun. 10, 2008 from Japan Application No. 2004-107240.

* cited by examiner

FIG. 3A
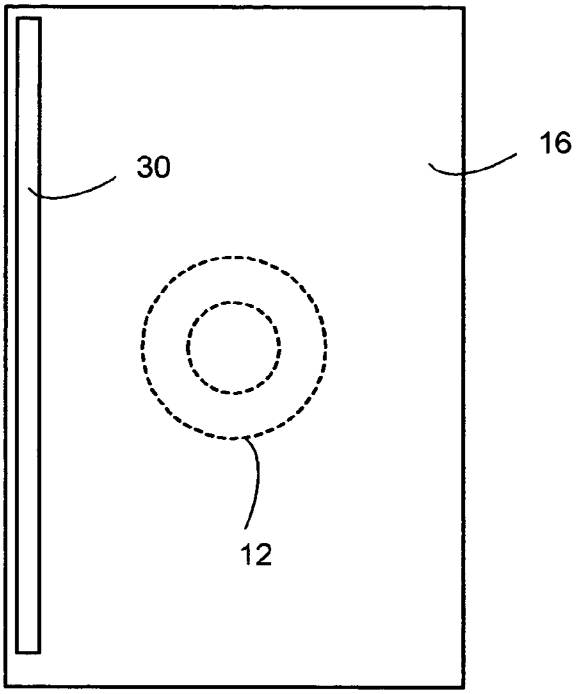
FIG. 3B
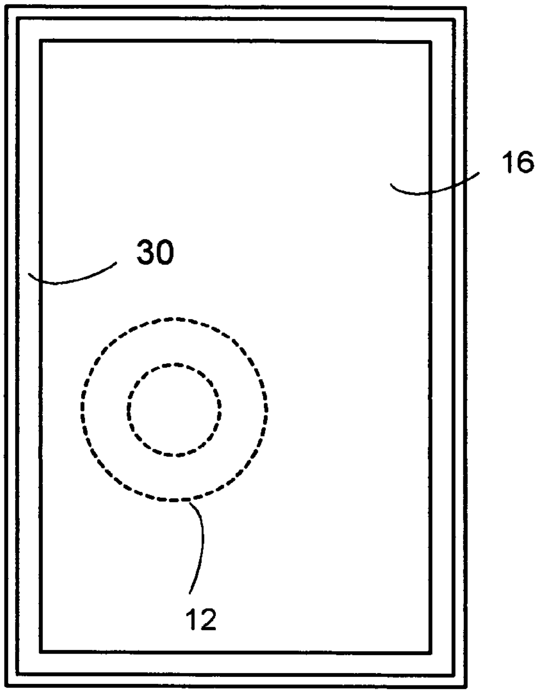
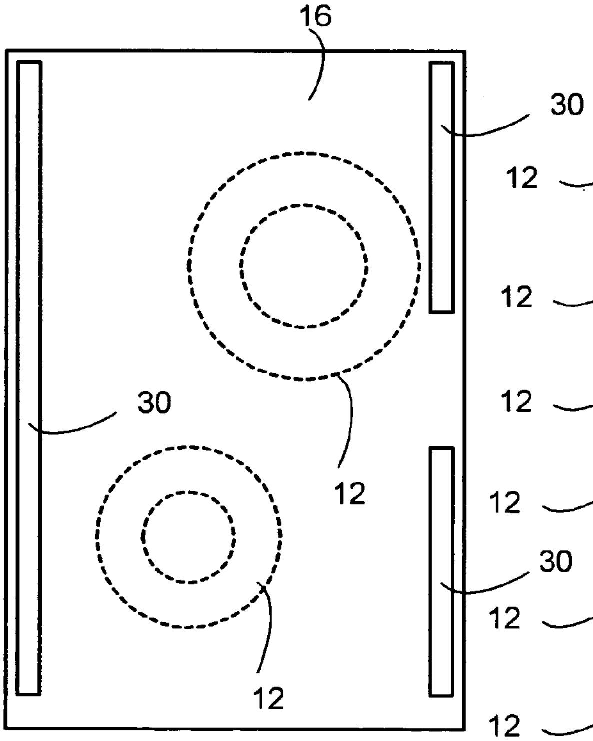
FIG. 3C
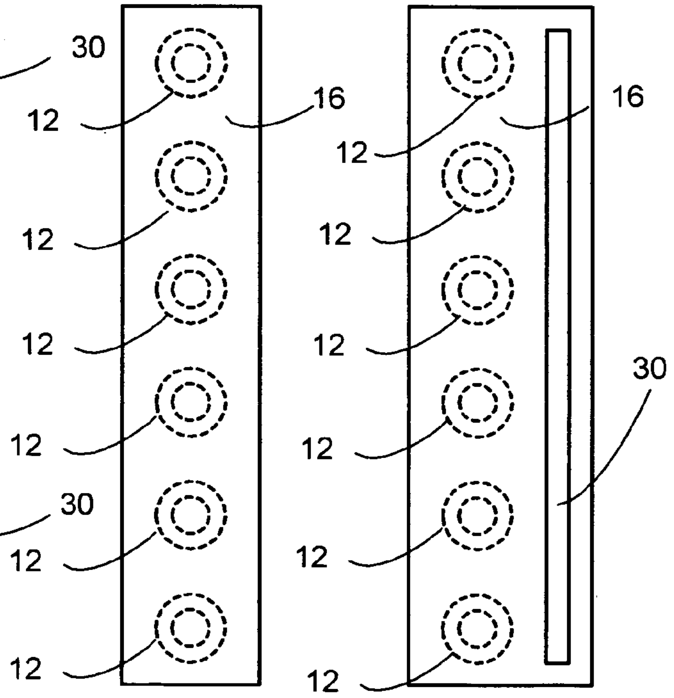
FIG. 3D

NARROW OPENING ELECTROACOUSTICAL TRANSDUCING

BACKGROUND OF THE INVENTION

The invention relates to wall mountable loudspeaker systems, and more particularly to high frequency loudspeaker systems having narrow openings through which acoustic energy can be radiated.

It is an important object of the invention to provide an improved loudspeaker system that can be easily integrated into the surrounding environment so that it is substantially imperceptible visually.

BRIEF SUMMARY OF THE INVENTION

According to the invention a loudspeaker system for mounting in a boundary of a listening space includes a first acoustic driver for radiating acoustic energy corresponding to audio signals. The loudspeaker system is constructed and arranged to be mounted in a cavity in the boundary defined by an opening in the boundary. The acoustic energy has a frequency response pattern. A substantially planar, acoustically opaque cover member has edges and is positioned between the acoustic driver and the listening space. The cover member is positioned so that the plane of the cover member is substantially parallel to the boundary. The cover member defines a slot between the cover member and the boundary. The slot acoustically couples the acoustic driver and the listening space.

In another aspect of the invention, a loudspeaker system, includes an acoustic driver for radiating high frequency acoustic energy, the acoustic energy having a frequency response pattern. The loudspeaker system also includes an enclosure, for enclosing the acoustic driver. The enclosure includes an opening acoustically coupling the acoustic driver and the listening space. The opening has a length and a width, the width of less than one inch. The opening acoustically couples the acoustic driver and a listening space. The acoustic energy interacts with the boundary and the opening to modify the frequency response pattern of the acoustic energy to provide a modified frequency response pattern. The loudspeaker system further includes an equalizer, for applying an equalization pattern to modify the audio signals so that the modified frequency response pattern matches a desired frequency response pattern.

Other features, objects, and advantages will become apparent from the following detailed description, when read in connection with the accompanying drawing in which:

BRIEF DESCRIPTION OF THE SEVERAL VIEWS OF THE DRAWING

FIGS. 3A-3D are simplified front plan views of alternate embodiments of a cover member of a loudspeaker system according to the invention;

DETAILED DESCRIPTION

Figure 1A:
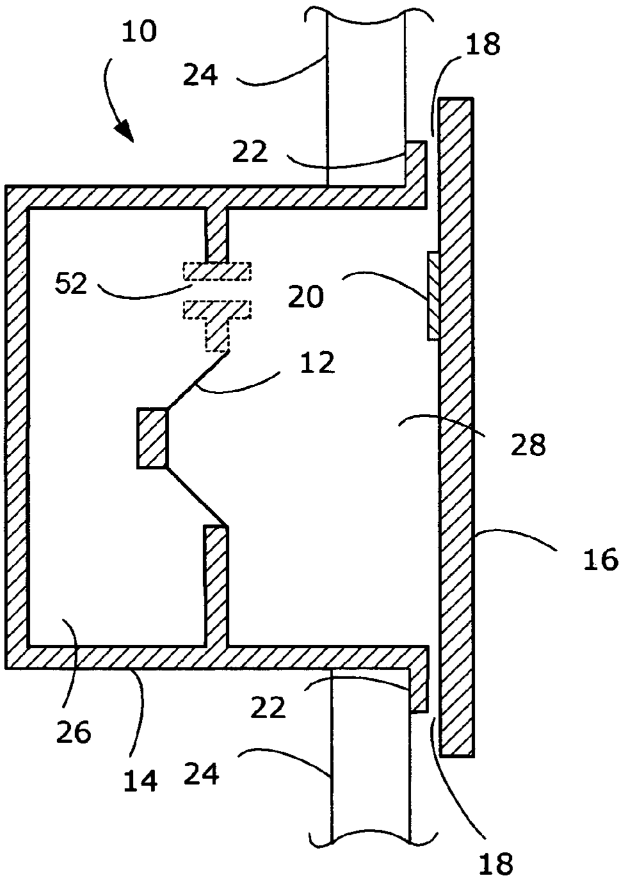
FIGS. 1A-1C are a simplified side cross-sectional view, a simplified top plan vies, and a simplified front plan view, respectively, of a loudspeaker system according to the invention.
Figure 1B:
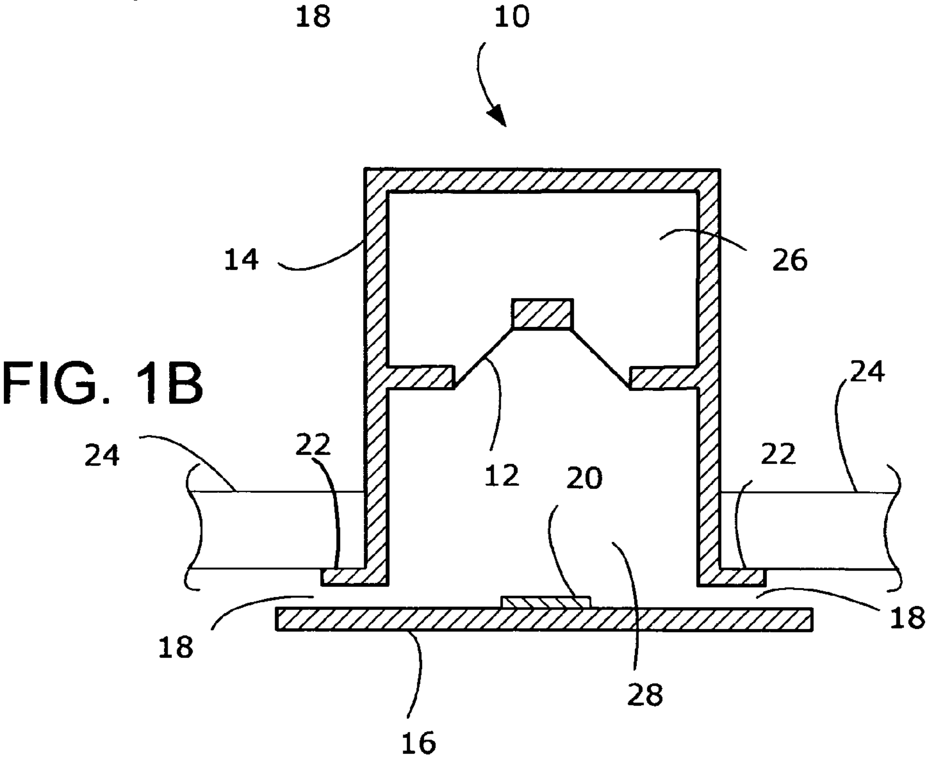
Figure 1C:
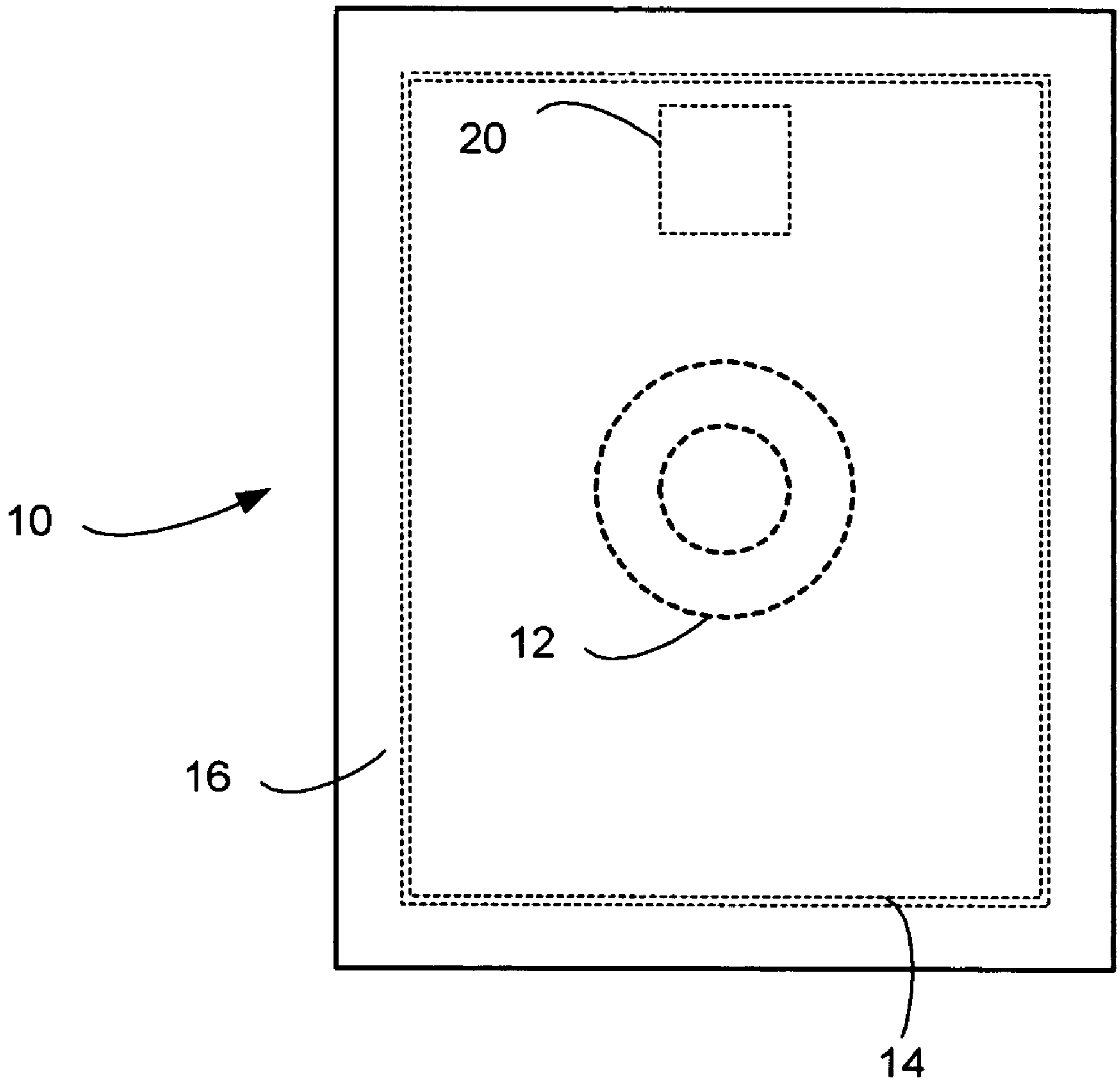

With reference now to the drawings and more particularly to FIGS. 1A, 1B, and 1C, there are shown a simplified side cross-sectional view, a simplified top cross-sectional view, and a simplified front plan view, respectively, of a loudspeaker system 10 according to the invention. Loudspeaker system 10 includes an acoustic driver 12 mounted in an enclosure 14. Cover member 16 is mounted so as to form a narrow gap 18 or slot between cover member 16 and enclosure 14 through which acoustic energy from acoustic driver 12 can be radiated to a listening space. On the cover member 16, there may be mounted an optional piezoelectric radiator 20. Enclosure 14 may include a flange portion 22 extending perpendicularly from an edge of enclosure 14. Cover member 16 may be mechanically coupled to enclosure 14 by fasteners (not shown), and spaced from enclosure 14 by standoffs (not shown) to define narrow gap 18. There may be some additional elements included, or measures taken, to alleviate vibration or "buzzing" of the cover member 16. Examples of additional elements added and measures taken may include a compliant pad placed between the standoff and the cover member, or rigidly attaching the cover member to the enclosure 14, or to some other surrounding structure. The listening space can be a room in a house, but is not restricted to rooms in houses; the listening area could be in a commercial building, outdoors, a cabin of an automobile, boat, airplane or some other vehicle, or some other listening area. For simplicity, the invention will be described as it would be installed in a room.

Loudspeaker system 10 may be mounted in a cavity in a listening space boundary, such as a wall, ceiling, or floor of a room, or vehicle cabin so that enclosure 14 is in a cavity defined by an opening in the boundary surface and so that cover member 16 is substantially parallel to the boundary surface. As most easily seen in FIG. 1C, cover member has a larger cross sectional area than the hole in boundary defining the cavity into which enclosure 14 is mounted. Cover member 16 is sufficiently close to the boundary so that cover member 16 obscures the enclosure 14. Flange portion 22, if present, can mate with the edges of a hole in a structural element, such as a section of wallboard 24. The enclosure 14 and the cover member 16 may be constructed and arranged so that narrow gap 18 may extend part of the way or all of the way around the perimeter of cover member 16. The narrow gap may be in the range of 0.3 inches (0.76 cm).

Acoustic driver 12 and piezoelectric radiator 20 can be conventional and communicatingly coupled to a source of audio signals, not shown. Piezoelectric radiator 20 may excite part or all of cover member 16 so that cover member 16 becomes an active part of the loudspeaker system. The characteristics and placement of the piezoelectric radiator may be based on acoustic considerations. The material, size and geometry of enclosure 14 may be based on acoustic considerations. Enclosure 14 may include a front volume 28 and rear volume 26, which may be acoustically coupled by an optional port 52. Cover member 16 may be constructed of a material that is coverable by conventional wall covering, such as paint or wallpaper, or by a conventional floor or ceiling covering.

A loudspeaker system according to the embodiment of FIGS. 1A-1C is advantageous because it can be mounted in an interior room surface and can be covered with the same material as the surrounding surface. The loudspeaker system can thereby be substantially imperceptible visually.

Figure 2A:
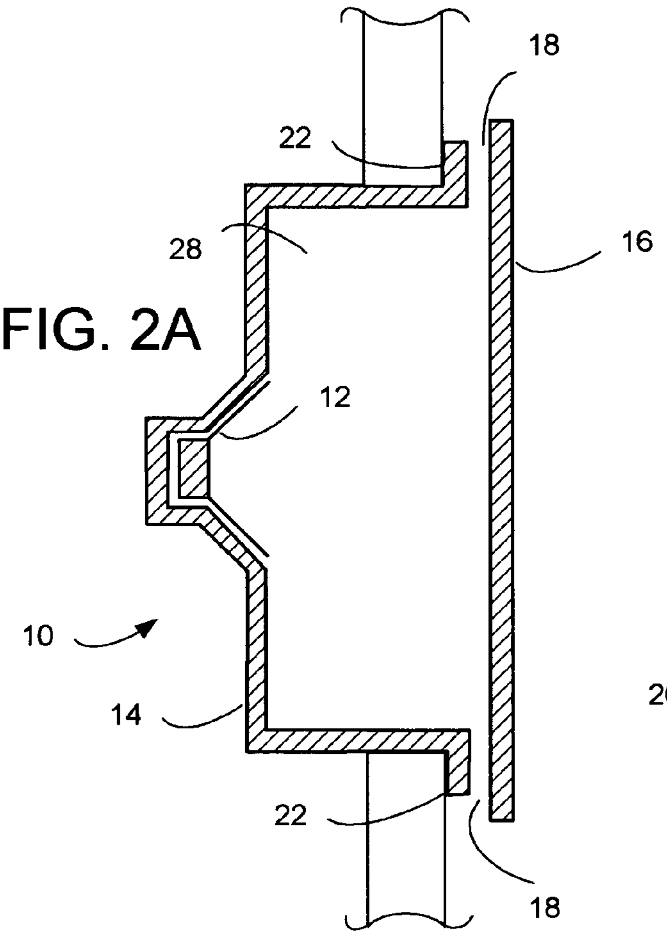
FIGS. 2A-2E are side cross-sectional views of a loudspeaker system according to the invention.
Figure 2B:
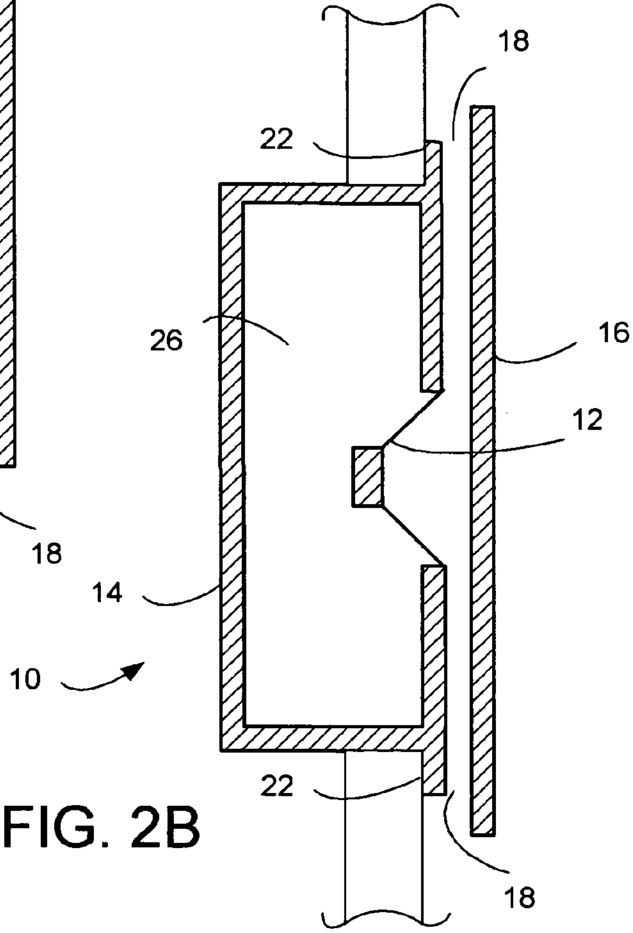
Figure 2C:
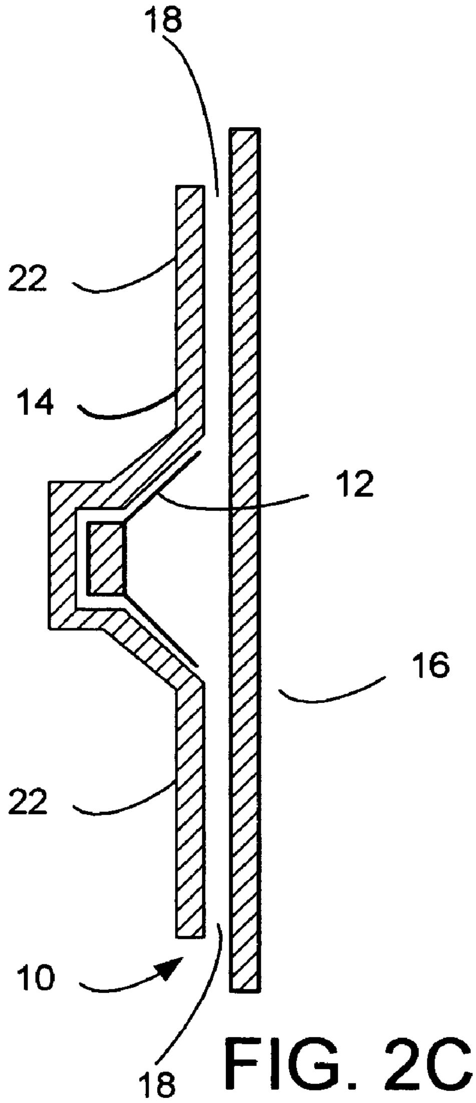
Figure 2D:
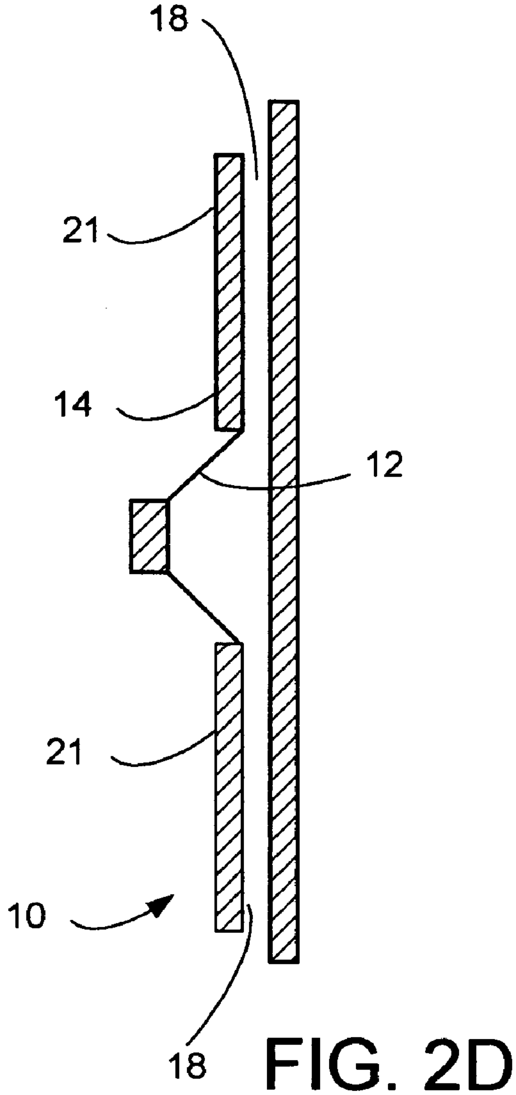
Figure 2E:
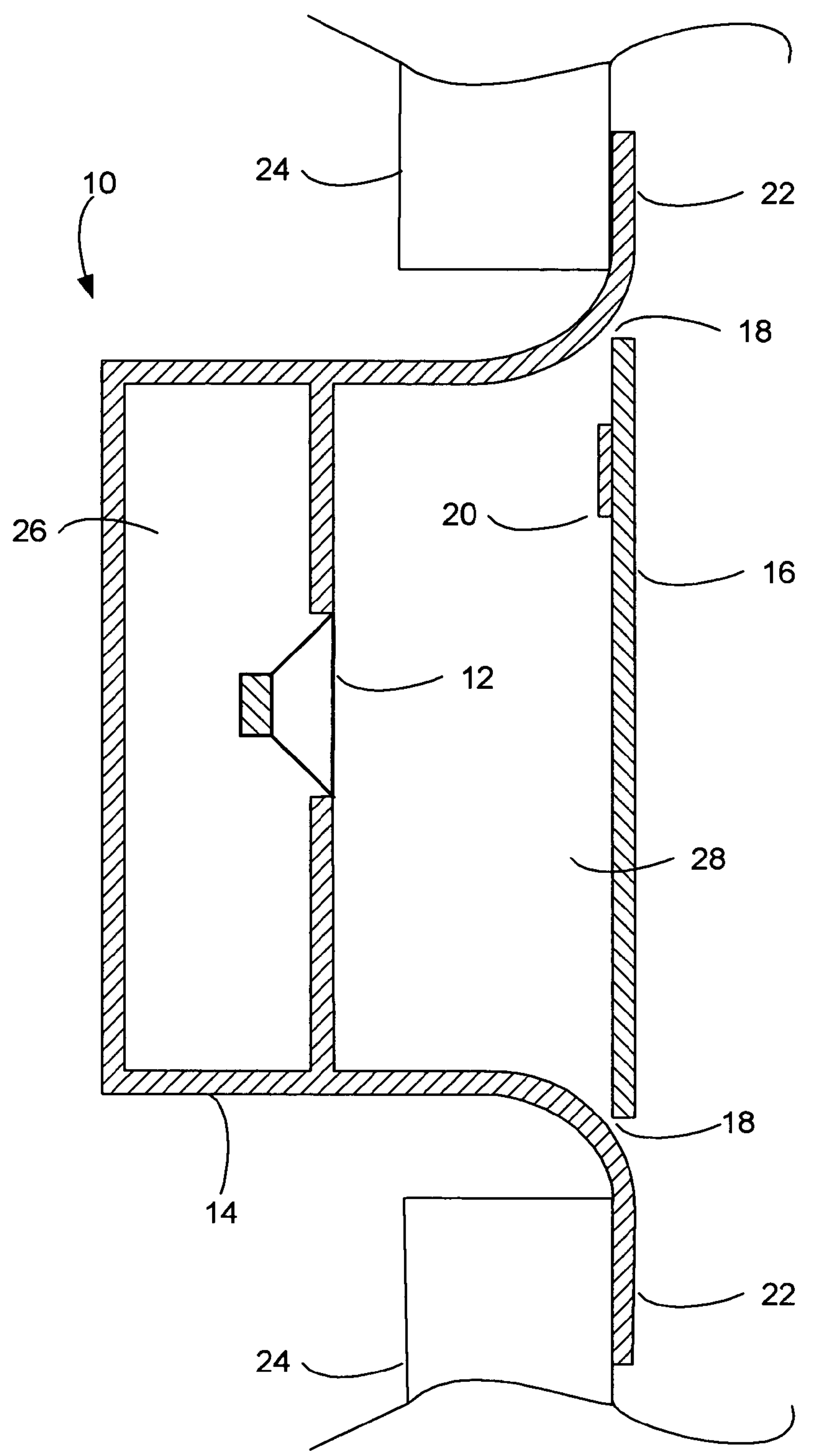

Referring now to FIGS. 2A-2D, there are shown some alternate embodiments of enclosure 14. In the embodiment of FIG. 2A, rear volume 26 of FIGS. 1A-1C is absent. In the embodiment of FIG. 2B, front volume 28 of FIGS. 1A-1C is absent. In the embodiment of FIG. 2C, both rear volume 26 and front volume 28 are absent. In FIG. 2D, the interior of the wall acts as the enclosure 14. Acoustic driver 12 may be mounted in a baffle 21 that is mountable to a wall, or the acoustic driver 12 may be mounted directly to the wall. The space in the wall acts as the rear volume 26 of other embodiments. In the alternate embodiment of FIG. 2E, the sides of the enclosure 14 curve outwardly near the opening, eliminating a perpendicular corner present in the other embodiments. Piezoelectric radiator 20 may also be present in these alternate embodiments, but is not shown in these views.

Referring to FIGS. 3A-3D, there are shown alternate embodiments of the cover member 16 of the previous figures. In the embodiment of FIG. 3A, cover member 16 may be sealingly coupled to enclosure 14 and narrow gap 18 of FIGS. 1A-1C can be replaced by narrow front opening 30 in cover member 16. The narrow front opening 30 of FIGS. 3A and 3C are in the shape of elongated rectangles. The narrow opening 30 in the surface of cover member 16 of FIG. 3B extends around the cover member 16 near the boundary. The narrow opening may be of uniform or variable width, and the narrow opening can extend collinearly or non-collinearly, and may have a width of from about 0.3 inches (0.76 cm) to about one inch (2.54 cm). The narrow opening does not need to be arranged so that the path from said the acoustic driver to the slot is perpendicular to the cover member. A loudspeaker system in which the path from the acoustic driver to the narrow opening is non-perpendicular is advantageous, because it conceals the acoustic driver, and protects the acoustic driver from damage.

FIGS. 3A-3C also illustrate alternate configurations of acoustic driver 12. In the embodiment of FIG. 3A, the acoustic driver 12 is positioned so that the center of a radiating surface of acoustic driver 12 faces the geometric center of the cover member. In the embodiment of FIG. 3B, the acoustic driver 12 is positioned so that the acoustic driver is positioned so that the center of a radiating surface of acoustic driver 12 does not face the geometric center of the cover member. In the embodiment of FIG. 3C, there is more than one acoustic driver, and the radiating surfaces of the two acoustic drivers are positioned asymmetrically to the boundaries of the cover member. In embodiments including multiple acoustic drivers, the drivers may be identical, or may be different, as shown. There may be several acoustic drivers arranged to form a line array, with either an elongated cover member, or an elongated narrow front opening, as shown in FIG. 3D. One or more piezoelectric radiators such as piezoelectric radiator 20 of FIGS. 1A-1C may also be present in these alternate embodiments, but is not shown in these views.

The narrow opening 30 may take on many forms and dimensions. The narrow opening may be substantially linear with parallel sides, as in the embodiments of 3A-3D, but may also be curved and the sides may be non-parallel. There may be more than one opening, and one or more of the openings may be discontinuous as in FIG. 3C. Substantially linear narrow openings such as the opening of the embodiment of FIG. 3A, or of an embodiment according to FIGS. 1A-1C with the narrow opening on one edge only, can be advantageous as they are less subject to high frequency comb filtering. The opening may also be in the sides, top, bottom, or in some combination of the top, sides, and bottom.

Figure 4:
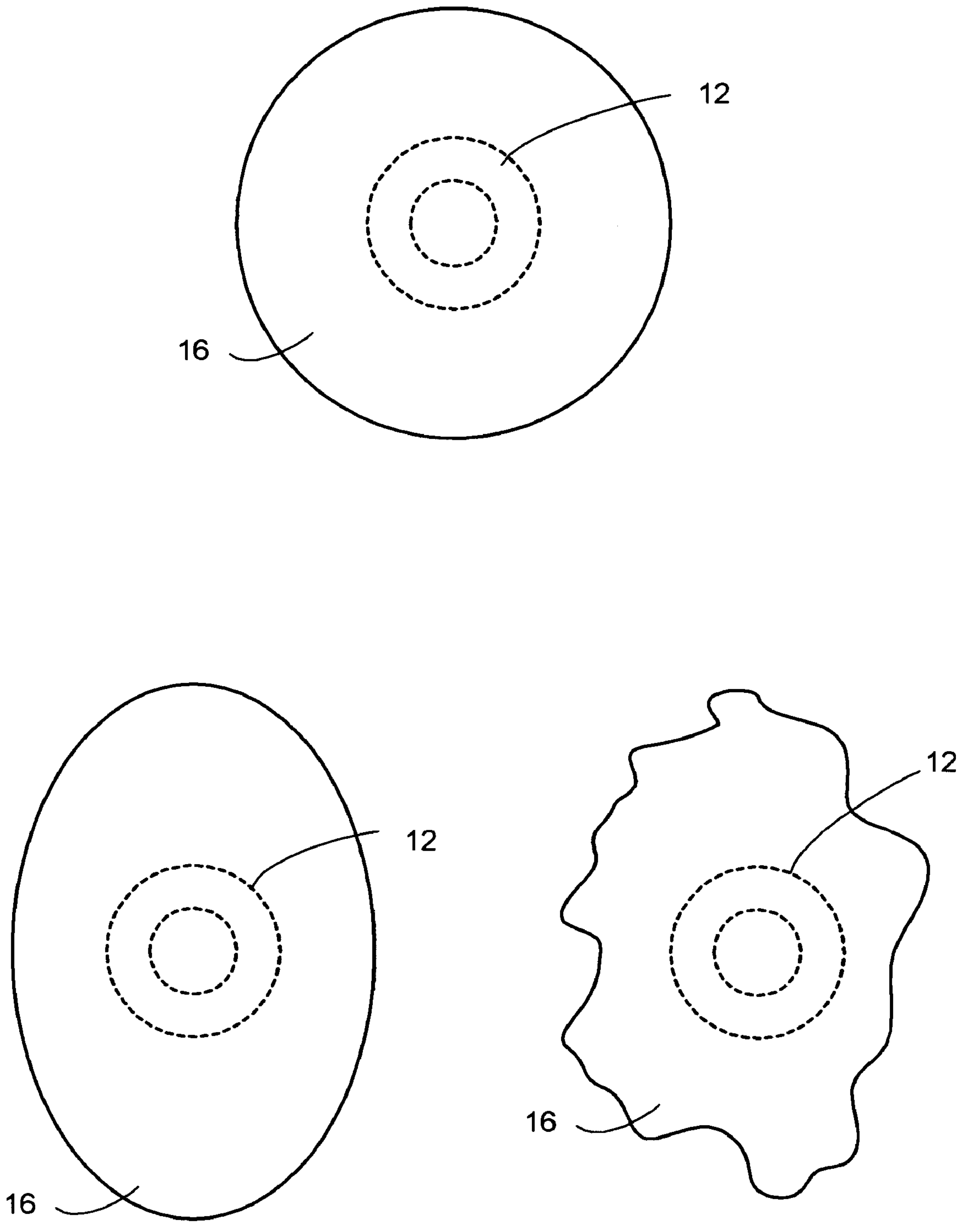
FIG. 4 shows front plan views of alternate embodiments of the cover member of a loudspeaker system according to the invention.

Referring to FIG. 4, there are shown alternate shapes for the cover member 16. The shape may be non-rectangular, such as circular or elliptical, or may be irregular. The shape of the cover member 16 and the placement of the acoustic driver 12 may be based on acoustic or cosmetic considerations. Typically, regularly shaped (such as circular) cover members and placement of the acoustic driver so that the axis of the acoustic driver is perpendicular to the cover member and intersects the cover member at the geometric center generally results in on-axis “beaming” and a frequency response pattern that is more uniform at positions off axis from the loudspeaker system. Typically, irregularly shaped cover members, placement of the acoustic driver so that the center of a radiating surface of the acoustic driver faces the cover member at a point other than the geometric center of the cover member, or orienting the acoustic driver so that the axis of the acoustic driver is not perpendicular to the cover member, or some combination, results less severe frequency response anomalies. Piezoelectric radiator 20 may also be present in this alternate embodiment, but is not shown in this view. If the piezoelectric radiator is present, the shape of the cover member 16 also affects the frequency response pattern of the piezoelectric radiator.

Figure 5:
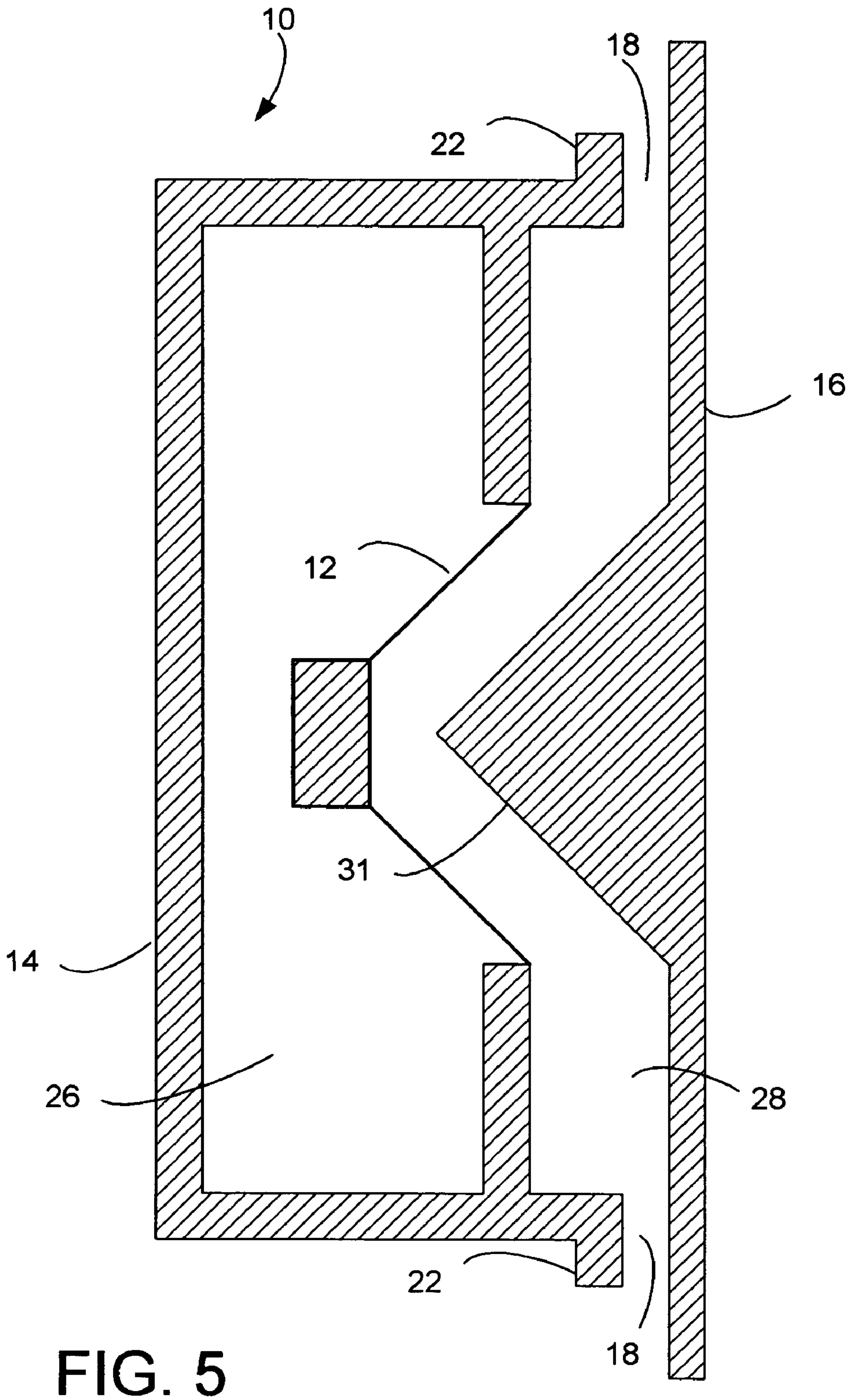
FIG. 5 is a side cross-sectional view of an additional optional feature of a cover member according to the invention.

Referring to FIG. 5, there is shown a variation of cover member 16. The surface of the cover member 16 that faces the acoustic driver may have a protuberance 31 or a baffle system. Protuberance 31 may extend from the interior surface of the cover member and may be shaped, dimensioned, and positioned, so that the surface of the protuberance acts as an element that reduces standing waves and other acoustic anomalies within enclosure 14. The surface of protuberances 31 may be substantially parallel to the radiating surface of the acoustic driver 12 or have some other shape that smoothes the frequency response pattern of the loudspeaker system. The protuberance may act as an acoustic element (for example, a phase plug, a diffuser, a flow director, or an acoustic load modifier) that reduces standing waves and other acoustic anomalies within the enclosure 14. Piezoelectric radiator 20 of FIGS. 1A-1C may also be present in this embodiment, but is not shown in this view.

Any of the loudspeaker systems of the previous figures can be configured so that the enclosures are conventional standalone enclosures instead of enclosures for in-wall or on-wall mounting. The front surface of the loudspeaker system can be made completely or substantially free of undesirable grilles and can be finished so that the front surface of the loudspeaker system cabinet can be made to blend with the surroundings, or so that the front surface can be used, without affecting the acoustic properties of the loudspeaker system, as a mounting point for elements that enable the loudspeaker system to serve as a furniture accessory. A loudspeaker system according to the invention can also be implemented in a portable device. A loudspeaker system according to the invention can also be configured so that the cover member is the top or bottom of the loudspeaker system.

Additionally any of the embodiments of the previous figures can use elements of the walls, ceiling, or floor as one of the elements of the invention. For example, a wall cavity can be used as a rear volume or the cover member can be attached directly to the wall, ceiling, or floor.

Figure 6:
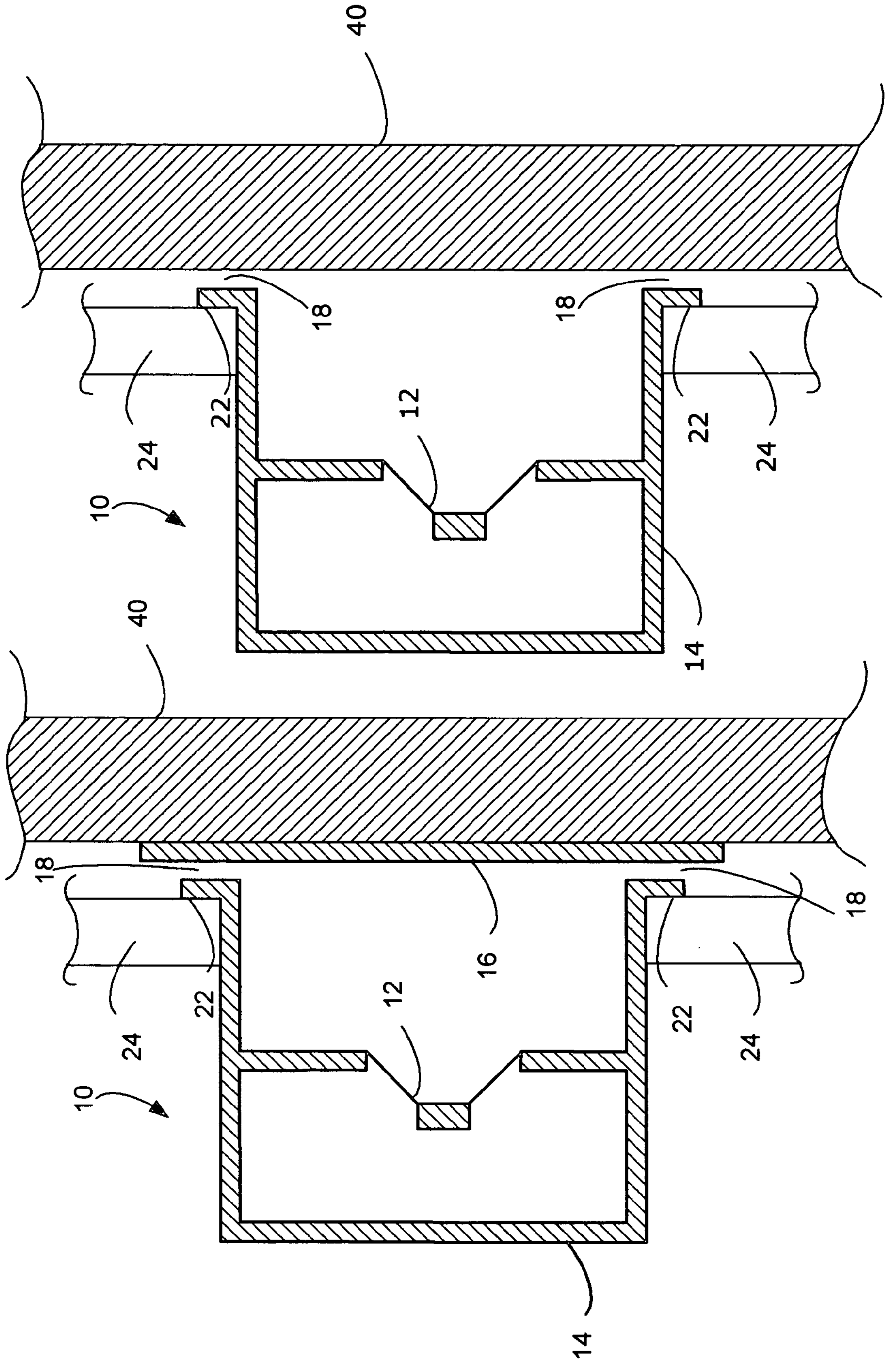
FIG. 6 show side cross-sectional views of alternate embodiments of the invention.

Referring to FIG. 6, there are shown other embodiments of the invention. The embodiment of FIG. 6 includes the elements of FIGS. 1A-1C. Cover member 16 is configured so that a wall hanging 40, such as a mounted painting, or ornamental element can be mechanically coupled to the cover member 16 to conceal cover member 16. The mechanical coupling can be accomplished by use of a fastener, such as a screw or bolt, by an adhesive, or by a picture hanging hook on the cover member with a wire or hanging bracket on the back of the wall hanging 40. In other embodiments, the elements may be configured so that wall hanging 40 can be mechanically coupled directly to enclosure 14, or so that the wall hanging can be mechanically coupled to and spaced from the wall. In an alternate configuration, the cover member is absent and appropriate standoffs and connectors are provided so the wall hanging 40 functions as the cover member.

Figure 7A:
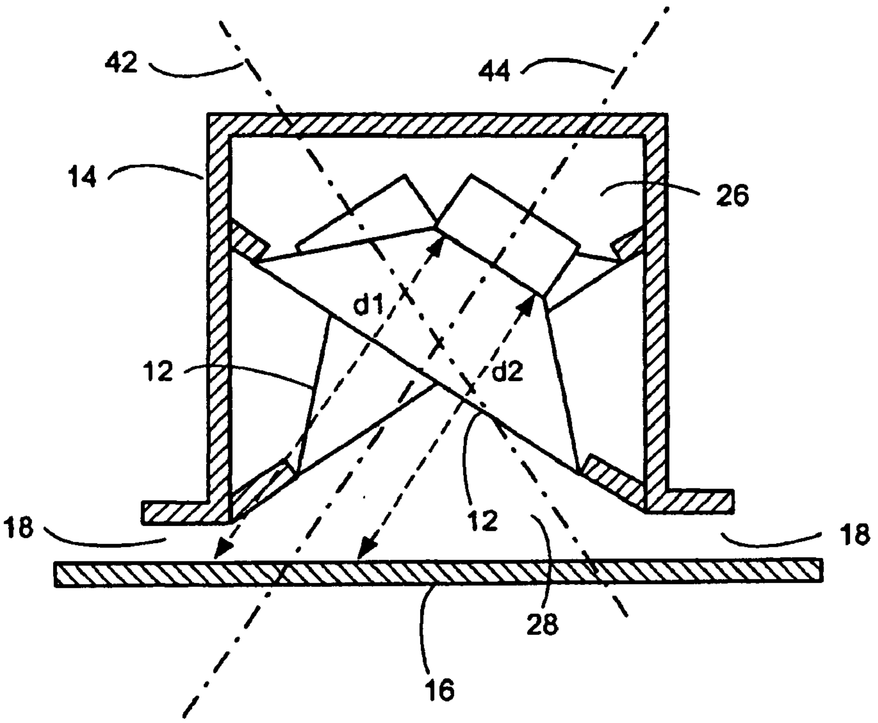
FIGS. 7A-7B are views of a practical implementation of the invention.
Figure 7B:
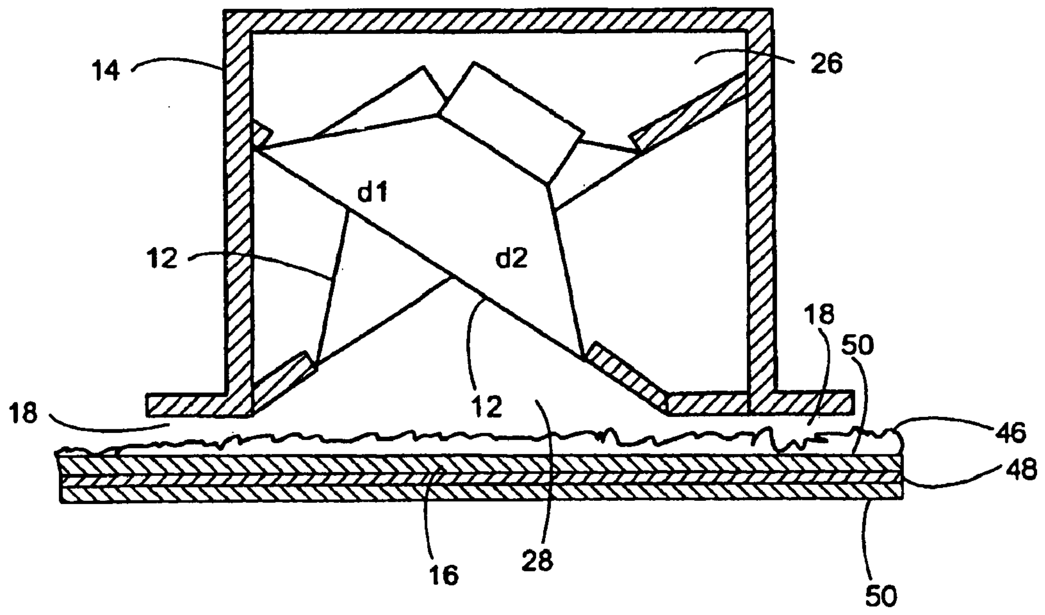

Referring now to FIGS. 7A-7B, there are shown practical implementations of a loudspeaker system according to the invention. Reference numbers in FIGS. 7A-7B refer to implementations of the correspondingly numbered elements of the other figures.

The enclosure 14 and the cover member 16 may be plastic. The acoustic drivers 12 may be 2 inch (5 cm) cone type acoustic drivers suitable for radiating high frequency acoustic energy in an audio system that has a separate woofer or subwoofer component. In other embodiments, the acoustic drives may be suitable for radiating full range acoustic energy by employing different acoustic drivers; by employing additional acoustic drivers; by modifying the dimensions of the enclosure 14, or by employing other acoustic techniques.

FIG. 7A shows a partially simplified cross sectional, partially simplified top plan view of the loudspeaker system. Acoustic drivers 12A and 12B are angled outwardly, so that at least one of the axes of motion 42 and 44 of the acoustic drivers intersects the cover member 16 at a non-perpendicular angle, for example about 25 degrees, and so that the distances (such as d1 and d2) from points on the radiating surface of said acoustic driver and equidistant from the axis to the cover member are different. The implementations of FIGS. 7A-7B also include an acoustic port (not shown) that acoustically couples rear volume 26 and the listening space that increases the output of the loudspeaker system.

A loudspeaker system according to the invention may be equalized by the manufacturer with a fixed or variable equalization pattern. For simplicity and cost of equalizing circuitry, it is desirable that differences in frequency response be less than 10dB. Angling the acoustic drivers outward assists in keeping the differences in frequency response within the desirable range. Additional techniques that may assist in keeping the differences in frequency response within a desire range are shown in FIG. 7B. The cover member 16 may be covered with damping material 46, or the cover member can be constructed as a highly damped material, such as a "sandwich" of damping material 48 between two thin plastic or thin metal layers 50. The acoustic drivers may be placed so that one or both of the acoustic drivers are positioned closer to one side of the enclosure than to the other side.

Additional room-specific frequency response anomalies can be caused by the interaction of the narrow opening with the surrounding wall, with nearby objects, or with other room specific characteristics. This is particularly true with an embodiment such as FIG. 6 in which the composition and the dimensions of wall hanging 40 may not be known prior to installation (because the wall hanging is user selectable the dimensions of the wall hanging are not known when the loudspeaker is manufactured), or in an embodiment such as FIG. 2D, in which the dimensions and characteristics of the enclosure 14 are not known prior to installation, and may vary considerably from installation to installation and even from loudspeaker system to loudspeaker system in the same installation. Thus the frequency response pattern of the loudspeaker system according to the invention can be particularly improved by an adaptive equalizer.

Figure 8:
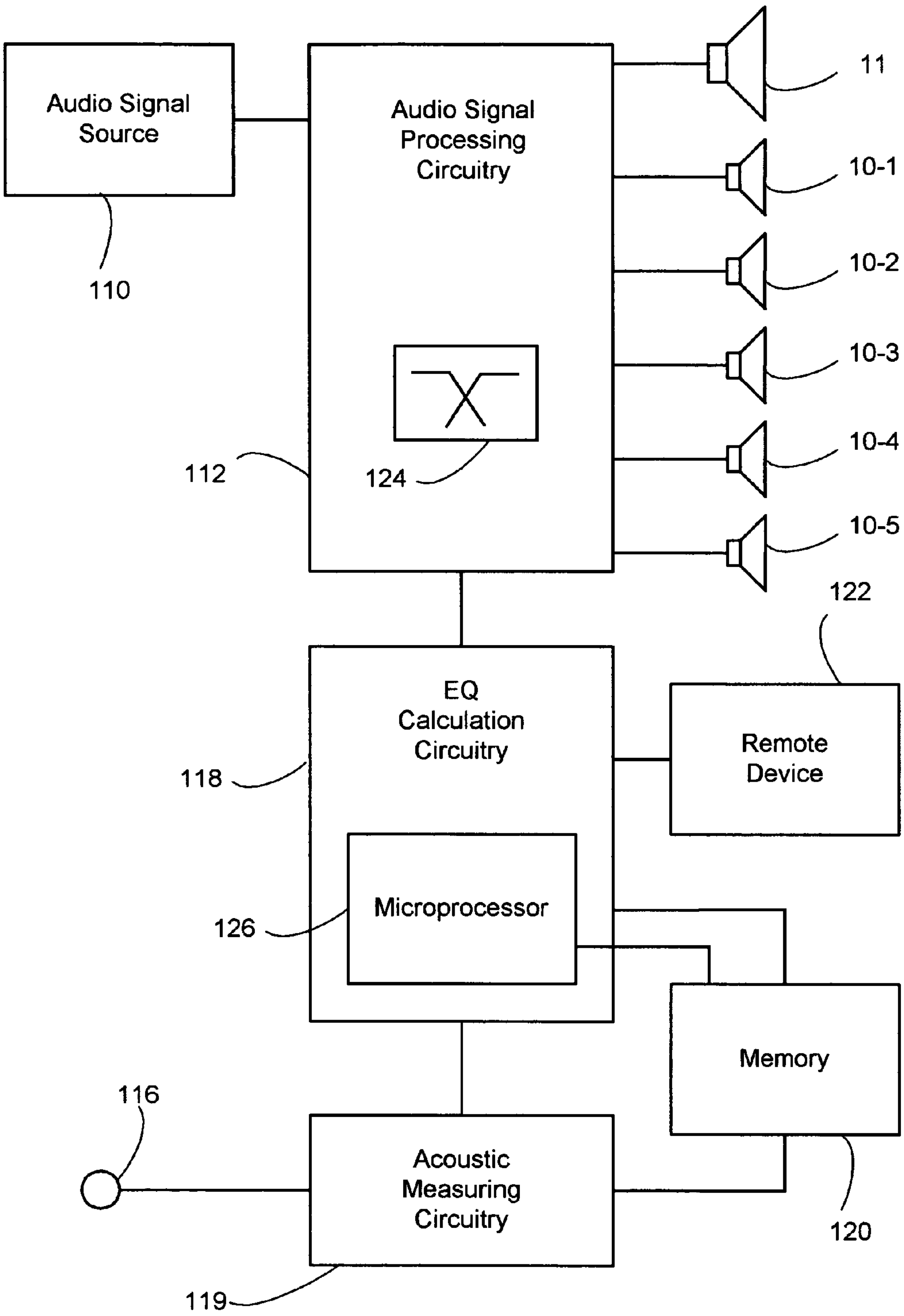
FIG. 8 is a block diagram of an audio system employing the invention.

Referring now to FIG. 8, there is shown an audio system including the invention. Audio signal source 110 is coupled to audio signal processing circuitry 112 which may contain crossover circuit 124. Audio signal processing circuitry 112 is in turn coupled to loudspeaker systems 11 and 10-1-10-5. One or more of loudspeaker systems 10-1-10-5 may be a loudspeaker system in accordance with the loudspeaker systems of the previous figures. Microphone device 116 is coupled to acoustic measuring circuitry 119, which is in turn coupled to equalization calculation circuitry 118 and to memory 120. Equalization calculation circuitry 118 may include microprocessor 126, and may be coupled to audio signal processing circuitry 112 and may be coupled to an optional remote device 122 and to memory 120.

Audio signal source 110 may be any of a variety of analog audio signal sources such as a radio, or, preferably, a digitally encoded audio signal source such as a CD player, a DVD or audio DVD player, or other source of digitally encoded audio signals, such as a "web radio" transmission or audio signals stored in digital form on a storage medium such as a compact disk, in random access memory, a computer hard disk or others. Audio signal processing circuitry 112 may include conventional audio signal processing elements (which can include both digital and analog components and digital to analog converters, amplifiers and others) to process the encoded audio signals, which are then transduced into acoustic energy by loudspeaker systems 11 and 10-1-10-5. Audio signal processing circuitry 112 may also include circuitry to decode the audio signals into multiple channels and also may include circuit elements, such as low latency infinite impulse response filters (IIRs) that can modify the frequency response of the audio system by implementing an equalization pattern developed by equalization calculation circuitry 118. Audio signal processing circuitry 112 may further include a crossover circuit 124 so that one of the loudspeaker systems, such as loudspeaker system 11 may be a subwoofer loudspeaker system, while the other loudspeaker systems may be high frequency loudspeaker systems. Alternatively, loudspeaker systems 10-1-10-5 may be full range loudspeaker systems, eliminating the need for low frequency loudspeaker system 11 and crossover circuitry, or may include both low and high frequency acoustic drivers in which case the crossover circuitry may be in the loudspeaker systems 10-1-10-5. In still another alternative, particularly if piezoelectric radiators are used, audio signal processing circuitry 112 and loudspeaker systems 10-1-10-5 may both include crossover circuitry that has more than one crossover frequency. For simplicity of explanation, the invention is described with a subwoofer loudspeaker system, a plurality of high frequency loudspeaker systems, with crossover circuit 124 in audio signal processing circuitry 112 having a single crossover frequency. Microphone device 116 may be a conventional microphone. Acoustic measuring circuitry may contain elements for receiving input from microphone 116 and measuring from the microphone input a frequency response pattern. Equalization calculation circuitry 118 may include a microprocessor 126 and other digital signal processing elements to receive digitized signals from microphone device 116 and develop a frequency response pattern, compare the frequency response pattern with a desired frequency response pattern, and develop an equalization pattern that, combined with the frequency response pattern detected by microphone device 116 causes loudspeaker systems 11 and 10-1-10-5 to radiate a desired frequency response pattern. The equalization pattern may be calculated by a software program running on a microprocessor 126. The software program may be stored in memory 120, may be loaded from a compact disk playing on digital audio signal source 110 implemented as a CD player, or may be transmitted from a remote device 122, which may be an internet link, a computer, a remote digital storage device, or another audio device. Alternatively, the optional remote device 122 may be a computer running a software program and transmitting information to equalization calculation circuitry 118. Memory 120 may be conventional random access memory. The audio system of FIG. 1 may be a component of a home theatre system that includes a video device such as a television or a projector and screen.

In one operational method, test audio noise or an audio waveform may be radiated responsive to an audio signal in a channel of audio signal source 110; alternatively, the source of the audio signal may be based on information stored in memory 120 or may be generated by computer instructions executed by microprocessor 126. Audio signal processing circuit 112 and loudspeaker systems 11 and 10-1-10-5 transduce the test audio signal to acoustic energy which is radiated into the room about which loudspeaker systems 11 and 10-1-10-5 are placed, creating a frequency response pattern from the interactions of the components of the loudspeaker systems and resulting from the interaction of the room with the loudspeaker systems. Acoustic energy detected by microphone device 116 is transmitted in electrical form to acoustic measuring circuitry 119. Acoustic measuring circuitry 119 measures the frequency response pattern, and stores the frequency response pattern in memory 120. Equalization calculation circuitry 118 calculates the equalization pattern appropriate to achieve a desired frequency response pattern, and stores the calculated equalization pattern in memory 120. Thereafter, when the audio signal processing circuitry 112 receives an audio signal from audio signal source 110, the equalization pattern is transmitted from memory 120 to audio signal processing circuitry 112, which applies the equalization pattern to the audio signals transmitted to loudspeaker systems 11 and 10-1-10-5 for transduction to acoustic energy. In some embodiments audio signal processing circuitry 112 may contain some elements, such as digital signal processing chips, in common with equalization calculation circuitry 118 and acoustic measuring circuitry 119. In another embodiment, portions of audio signal processing circuitry 112, acoustic measuring circuitry 119 and equalization calculation circuitry 118 may be in a so-called "head unit" (that is, the device that contains signal sources, such as a tuner, or CD player, or connections to external signal sources, or both), and on which the controls, such as source selection and volume are located, and other portions may be in one of the loudspeaker systems 11 and 10-1-10-5 such as a subwoofer unit 11, or distributed among the loudspeaker systems 11 and 10-1-10-5. This implementation facilitates a head unit that can be used with a variety of loudspeaker systems, while the portions of the audio signal processing circuitry 112 and equalization calculation circuitry 118 that are specific to the loudspeaker system are in one of the loudspeaker systems.

FIG. 8 describes a specific adaptive equalizer, described in more detail in U.S. pat. app. Ser. No. 10/105,206, filed Mar. 25, 2002, and attached as Appendix A. However, a wide range of adaptive equalizers can be used.

An audio system in accordance with the audio system of FIG. 8 is advantageous because a desired frequency response pattern can be produced from loudspeaker systems that may otherwise have anomalous frequency response patterns due to the configuration of the speaker and the interaction with the wall and nearby objects. The system is especially useful with loudspeaker systems such as the loudspeaker system of FIG. 6, because the wall hanging is effectively a part of the loudspeaker system. Because the dimensions, shape, and other physical and acoustic properties are not known before installation, an equalization performed before installation may not result in the desired frequency response pattern. A system according to FIG. 8 is also especially useful with audio systems in which different numbers and combinations of loudspeaker systems may be of the type described in previous figures, because each different combination of loudspeaker systems would require a different system equalization. An audio system according to FIG. 8 can be equalized by the consumer in a manner that corrects for frequency response pattern anomalies resulting from the characteristics of the loudspeaker system themselves and frequency response pattern anomalies resulting from the interaction of the loudspeaker systems with the specific room in which they are placed.

It is evident that those skilled in the art may now make numerous uses of and departures from the specific apparatus and techniques disclosed herein without departing from the inventive concepts. Consequently, the invention is to be construed as embracing each and every novel feature and novel combination of features disclosed herein and limited only by the spirit and scope of the appended claims.

What is claimed is:

1. A loudspeaker system for mounting in a boundary of a room, comprising:

a first acoustic driver for radiating energy corresponding to audio signal, constructed and arranged to be mounted in a cavity in said boundary, said cavity defined by an opening in said boundary, said acoustic energy having a frequency response pattern;

a substantially planar, acoustically opaque cover member having edges, positioned between said acoustic driver and said room, and further positioned so that the plane of said cover member is substantially parallel to said boundary;

said cover member defining a slot between said cover member and said boundary, said slot acoustically coupling said acoustic driver and said room.

2. A loudspeaker system in accordance with claim 1, further comprising an acoustic enclosure for enclosing said acoustic driver, wherein said acoustic enclosure is designed and constructed to mechanically couple with said cover member and to be mounted in said cavity.

3. A loudspeaker system in accordance with claim 2, further comprising mechanical standoffs, for separating said cover member from said enclosure.

4. A loudspeaker system in accordance with claim 2, area of said cover member is greater that the area of said boundary opening.

5. A loudspeaker system in accordance with claim 2, wherein said enclosure comprises a baffle for mounting said acoustic driver and for defining a first acoustic volume and a second acoustic volume.

6. A loudspeaker system in accordance with claim 5, further comprising an acoustic port for acoustically coupling said first acoustic volume and said one of said second acoustic volume and said room.

7. A loudspeaker system in accordance with claim 1, wherein said cover member constructed and arranged to couple to said boundary to define said slot.

8. A loudspeaker system in accordance with claim 1, wherein a wall hanging comprises said cover member.

9. A loudspeaker system in accordance with claim 3, wherein said wall hanging is user selectable, so that the dimensions of said wall hanging are not known when said loudspeaker is manufactured.

10. A loudspeaker system in accordance with claim 1, said boundary having a covering, wherein said cover member is constructed and arranged to he coverable by said covering.

11. A loudspeaker system in accordance with claim 10, wherein said covering is one of a group consisting of paint, and wallpaper.

12. A loudspeaker system in accordance with claim 1, wherein the width of said opening is less than one inch.

13. A loudspeaker system in accordance with claim 1, wherein said cavity is defined by said boundary and by elements supporting said boundary.

14. A loudspeaker system in accordance with claim 1, wherein said acoustic energy interacts with said boundary and said opening to modify said frequency response pattern of said acoustic energy to provide a modified frequency response pattern.

an equalizer, for applying an equalization pattern, to modify said audio signal so that said modified frequency response pattern matches a desired frequency response pattern.

15. A loudspeaker system in accordance with claim 14, said equalizer comprising circuitry for measuring said modified frequency response pattern and equalization calculation circuitry for providing said equalization pattern and signal processing circuitry for applying said equalization circuitry.

16. A loudspeaker system in accordance with claim 1, wherein said cover member is irregularly shaped.

17. A loudspeaker system in accordance with claim 1, wherein said slot extends along a portion of the perimeter of said cover member.

18. A loudspeaker system in accordance with claim 1, wherein said slot extends along substantially the entire perimeter of said cover member.

19. A loudspeaker system in accordance with claim 1, said cover member defining a plurality of openings.

20. A loudspeaker system, comprising:

an acoustic driver for radiating high frequency acoustic energy, said acoustic energy having a frequency response pattern;

an enclosure, for enclosing said acoustic driver, the enclosure constructed and arranged to be mounted in a cavity in a boundary of a room;

a substantially planar, acoustically opaque cover member having edges, positioned between said acoustic driver and said room, and further positioned so that the plane of said cover member is substantially parallel to said boundary;

said cover member defining a slot between said cover member and said boundary, said slot acoustically coupling said acoustic driver and said room;

said slot comprising an opening having a width of less than one inch, wherein said acoustic energy interacts with the boundary and said opening to modify said frequency response pattern of said acoustic energy to provide a modified frequency response pattern; and an equalizer, for applying an equalization pattern to modify said audio signals so that said modified frequency response pattern matches a desired frequency response pattern.

21. A loudspeaker system in accordance with claim 20, said equalizer comprising equalization calculation circuitry for providing said equalization pattern.

22. A loudspeaker system in accordance with claim 20, said enclosure further comprising a cover member having a substantially planar surface facing the interior of said enclosure, wherein said planar surface is constructed and arranged to define said narrow opening, said opening defining an acoustic path for said acoustic energy to radiate into said room, wherein said path is substantially parallel to said planar surface.

23. A loudspeaker system in accordance with claim 22, said equalizer comprising circuitry for measuring said modified frequency response pattern and equalization calculation circuitry for providing said equalization pattern and signal processing circuitry for applying said equalization circuitry.

24. A loudspeaker system in accordance with claim 20, wherein said enclosure is designed and constructed to be mountable in a cavity in a wall of the room.

25. A loudspeaker system in accordance with claim 20, wherein said cover member is irregularly shaped.

26. A loudspeaker system in accordance with claim 20, said cover member comprising a plurality of openings.

* * * * *